United States Patent
Yang

(10) Patent No.: US 10,914,002 B2
(45) Date of Patent: Feb. 9, 2021

(54) APPARATUS AND PROCESS FOR SEMI-CONTINUOUS AND MULTI-STEP COMPOSITE PRODUCTION

(71) Applicant: California Lithium Battery, Inc., Brea, CA (US)

(72) Inventor: Junbing Yang, Fullerton, CA (US)

(73) Assignee: CLB Americas, Inc., Brea, CA (US)

( * ) Notice: Subject to any disclaimer, the term of this patent is extended or adjusted under 35 U.S.C. 154(b) by 727 days.

(21) Appl. No.: 15/096,051

(22) Filed: Apr. 11, 2016

(65) Prior Publication Data

US 2016/0298234 A1 Oct. 13, 2016

Related U.S. Application Data

(60) Provisional application No. 62/146,304, filed on Apr. 12, 2015.

(51) Int. Cl.
| | |
|---|---|
| *C23C 16/24* | (2006.01) |
| *C23C 16/442* | (2006.01) |
| *H01M 4/38* | (2006.01) |
| *H01M 4/587* | (2010.01) |
| *H01M 4/36* | (2006.01) |
| *C23C 16/44* | (2006.01) |

(52) U.S. Cl.
CPC ............ *C23C 16/442* (2013.01); *C23C 16/24* (2013.01); *C23C 16/4417* (2013.01); *H01M 4/364* (2013.01); *H01M 4/386* (2013.01); *H01M 4/587* (2013.01)

(58) Field of Classification Search
CPC combination set(s) only.
See application file for complete search history.

(56) References Cited

U.S. PATENT DOCUMENTS

| | | | | |
|---|---|---|---|---|
| 3,879,352 A | * | 4/1975 | Ames ..................... | C08G 63/08 526/65 |
| 2012/0282527 A1 | * | 11/2012 | Amine ................... | H01M 4/366 429/231.8 |
| 2014/0106219 A1 | * | 4/2014 | Wang .................... | H01M 4/134 429/218.1 |
| 2014/0263166 A1 | * | 9/2014 | Shin ....................... | B82Y 30/00 216/13 |
| 2015/0182930 A1 | * | 7/2015 | Hazeltine ............... | B01J 8/1872 427/213 |

OTHER PUBLICATIONS

PCT Application No. PCT/US2016/027140 International Search Report and Written Opinion dated Jul. 8, 2016.

* cited by examiner

*Primary Examiner* — Monique R Peets
(74) *Attorney, Agent, or Firm* — Bachmann Law Group PC

(57) ABSTRACT

A method and apparatus produce silicon-carbon composite materials through a chemical vapor deposition or a thermal disposition process in a fluidized bed reactor on a semi-continuous basis. The produced silicon-carbon composite has a unique structure that silicon particles are uniformly dispersed, bonded and embedded into the carbon conductive matrix and forming a secondary structure. The produced silicon-carbon composite can be used as advanced anode materials for lithium battery and other electrochemical energy storage device.

11 Claims, 9 Drawing Sheets

APPARATUS AND PROCESS FOR SEMI-CONTINUOUS AND MULTI-STEP COMPOSITE PRODUCTION

CROSS-REFERENCE TO RELATED APPLICATIONS

This application claims the priority benefit of U.S. Provisional Application Ser. No. 62/146,304, titled "Apparatus and Process for Semi-Continuous Composite Production," filed Apr. 12, 2015, the disclosure of which is incorporated herein by reference.

BACKGROUND

1. Field of the Invention

The present technology is generally related to lithium ion batteries. More specifically, it is related to a process to produce composite materials that can be used as advanced anode materials for lithium ion batteries.

2. Description of Related Art

The use of Li-ion batteries (LIBs) as rechargeable power sources represents a promising technology for use in consumer electronics, automobiles and energy storage. However, there are substantial technical challenges to the use of LIBs for consumer electronics, automobile and energy storage applications. Further improvement of LIBs require the development of new cathode, anode and electrolyte materials with desired properties.

Silicon-carbon composites are promising anode materials for LIBs due to their excellent high capacity and long cycle life. Among many approaches to produce these materials, incorporating silicon into carbon through a chemical vapor deposition (CVD) process produces uniform material structure and good performance. For best battery performance the silicon to carbon ratio in the composite should be constant through the anode CVD of silicon onto carbon materials is usually performed using a batch type reactor such as fluidized bed reactors (FBR reactor), rotary reactors and V-blenders in order to control the deposition time and hence produce a constant silicon to carbon ratio in the material. Batch processes have significant inefficiencies when operated at large scale. For example, batch processes incur large down-times due to cool-down and re-heat requirements. At the end of each batch, the equipment needs to be cooled down (typically to room temperature) before the finished product can be removed from the reaction equipment and fresh starting materials can be re-charged to the equipment. The equipment then needs to be re-heated to a high temperature for subsequent batch production. The prior art processes of heating, cooling and re-heating the equipment uses a lot of energy (electricity) and leads to long down times.

Polycrystalline silicon is the raw material for solar cells and is produced through a chemical vapor deposition (CVD) process. In this CVD process, a silicon-containing precursor is decomposed on a silicon substrate to form solid silicon. In some cases, the CVD of silicon is performed in a FBR reactor.

Polysilicon production through an FBR based CVD process provides high throughput compared to traditional Siemens type CVD process, which is inherently a batch process. The high throughput is due at least in part because the CVD process enables a continuous supply of silicon precursor and continuous separation of final product from the starting silicon seeds. In some implementations, the silicon precursor gas may include one or more of SiH4 (monosilane), Si2H6 (disilane), Si3H8 is trisilane), SiH2Cl2 (dichlorosilane), SiHCl3 (trichlorosilane), SiH2Br2 (dibromosilane), SiHBr3 (tribromosilane), SiH2I2 (diiodosilane), SiHI3 (triiodosilane), SiI4 (silicon tetraiodide).

In the FBR-CVD process, small silicon seeds are supplied as substrate for silicon deposition through chemical decomposition of a silicon containing precursor. The silicon particle size grows bigger with silicon deposition. The large silicon particles and small silicon seeds can be separated aerodynamically in the FBR reactor since they have different practical size and weight. The larger silicon particles will drop down to the bottom of the FBR chamber and be removed from the chamber. Alternatively, they can be removed from the reactor and separated by sieving. Even with such separation techniques the resulting product has particles which have spent significantly different residence times in the reactor undergoing deposition. However, this has no effect on the usefulness of the polysilicon product since there is no change in composition. In the case of silicon deposition on carbon, having significantly different deposition times would cause the product to have a mix of silicon to carbon ratios which is deleterious to its use as an anode material in Lithium ion batteries.

A CVD process to produce silicon-carbon composite can use a similar FBR reactor as used for polysilicon production, but has the additional challenges of maintaining a constant silicon to carbon ratio and separating the final product from the starting carbon powders. In the silicon-carbon composite system, the composite typically has similar morphology, particle size, and density to the starting carbon particles. As a result, it is difficult to separate the silicon-carbon composite with carbon powder using the same separation processes employed in current FBR CVD process for polysilicon production. The use of such a reactor in continuous mode with ongoing addition of graphite material and continuous removal of product would provide an inferior product with an inconsistent silicon to carbon ratio. There is a need for an improved FBR-CVD process in the polysilicon process in order to use it for silicon-carbon composite production.

SUMMARY

The present technology produces silicon-carbon composite materials through a chemical vapor deposition process in a fluidized bed reactor on a semi-continuous basis. A process is disclosed that makes it possible to produce the composite particles which have similar density and morphology between the starting material and the final product on a continuous basis. A semi-continuous process and apparatus may produce a silicon-carbon composite and can precociously control the silicon morphology in the carbon material to avoid the over growth of silicon particles. The silicon-carbon composites produced from the present technology have completely different morphology and properties compared to the polysilicon produced from FBR-CVD process. The silicon-carbon composites also have different application to polysilicon.

A high temperature fluidized-bed reactor and process produces a silicon (Si) composite anode material that can be used to substantially increase lithium-ion battery specific capacity (2,000 mAh/gr+) compared to traditional graphite anode materials (375 mAh/gr) used in most lithium batteries today. In the apparatus, Silicon particles are deposited, bonded, and uniformly embedded in the graphite/graphene based multi-layered nano-platelets to form a stable and commercially scalable silicon composite anode material. The silicon composite anode material may be used for lithium batteries in consumer electronic devices, electric vehicles, and energy storage systems for renewables. This apparatus, process, and material has demonstrated great potential for dramatically improving energy density, reducing cell size and weight, all while lowering levelized costs of lithium batteries.

An implementation may include a method for generating a composite. The method may include performing controlled silicon loading on a first carbon substrate in a reactor. The carbon substrate may be transferred from the reactor to a reservoir. A controlled silicon loading may be performed on a second carbon substrate in the reactor while the first carbon substrate cools in the reservoir.

An implementation may include an apparatus for generating a composite. The apparatus may include a reactor and a reservoir. The reactor may perform a silicon vapor deposition process to generate a first carbon substrate. The reservoir may receive the first carbon substrate and allow the reactor to perform a second silicon vapor deposition process to generate a second carbon substrate while the first carbon substrate cools in the reservoir.

An implementation may include a composite structure. The composite structure may include a plurality of graphene layers and a plurality of silicon particles. The plurality of graphene layers may form two or more gaps, wherein each gap is formed by a respective upper graphene layer and a respective lower graphene layer of the plurality of graphene layers. The plurality of silicon particles may be embedded within each gap formed by the plurality of graphene layers.

DETAILED DESCRIPTION

A high temperature fluidized-bed reactor and process produces a silicon (Si) composite anode material that can be used to substantially increase lithium battery specific capacity (2,000 mAh/gr+) compared to traditional graphite anode materials (375 mAh/gr) used in most lithium batteries today. In the apparatus, Silicon particles are deposited, bonded, and uniformly embedded in graphite/graphene based multi-layered nano-platelets to form a stable and commercially scalable silicon composite anode material. The silicon composite anode material may be used for lithium batteries in consumer electronic devices, electric vehicles, and energy storage systems for renewables. This apparatus, process, and material has demonstrated great potential for dramatically improving energy density, reducing cell size and weight, all while lowering levelized costs of lithium batteries.

The present technology produces silicon-carbon composite materials through a chemical vapor deposition process or a thermal deposition process in a fluidized bed reactor on a semi-continuous basis. A process is disclosed that makes it possible to produce the composite particles which have similar density and morphology between the starting material and the final product on a semi-continuous basis. A semi-continuous process and apparatus may produce a silicon-carbon composite and can precociously control the silicon morphology in the graphite/graphene and their derivatives to avoid the over growth of silicon particles. The silicon-carbon composites produced from the present technology have completely different morphology and properties compared to the polysilicon produced from FBR-CVD process. The silicon-carbon composites also have different application to polysilicon.

Figure 1:
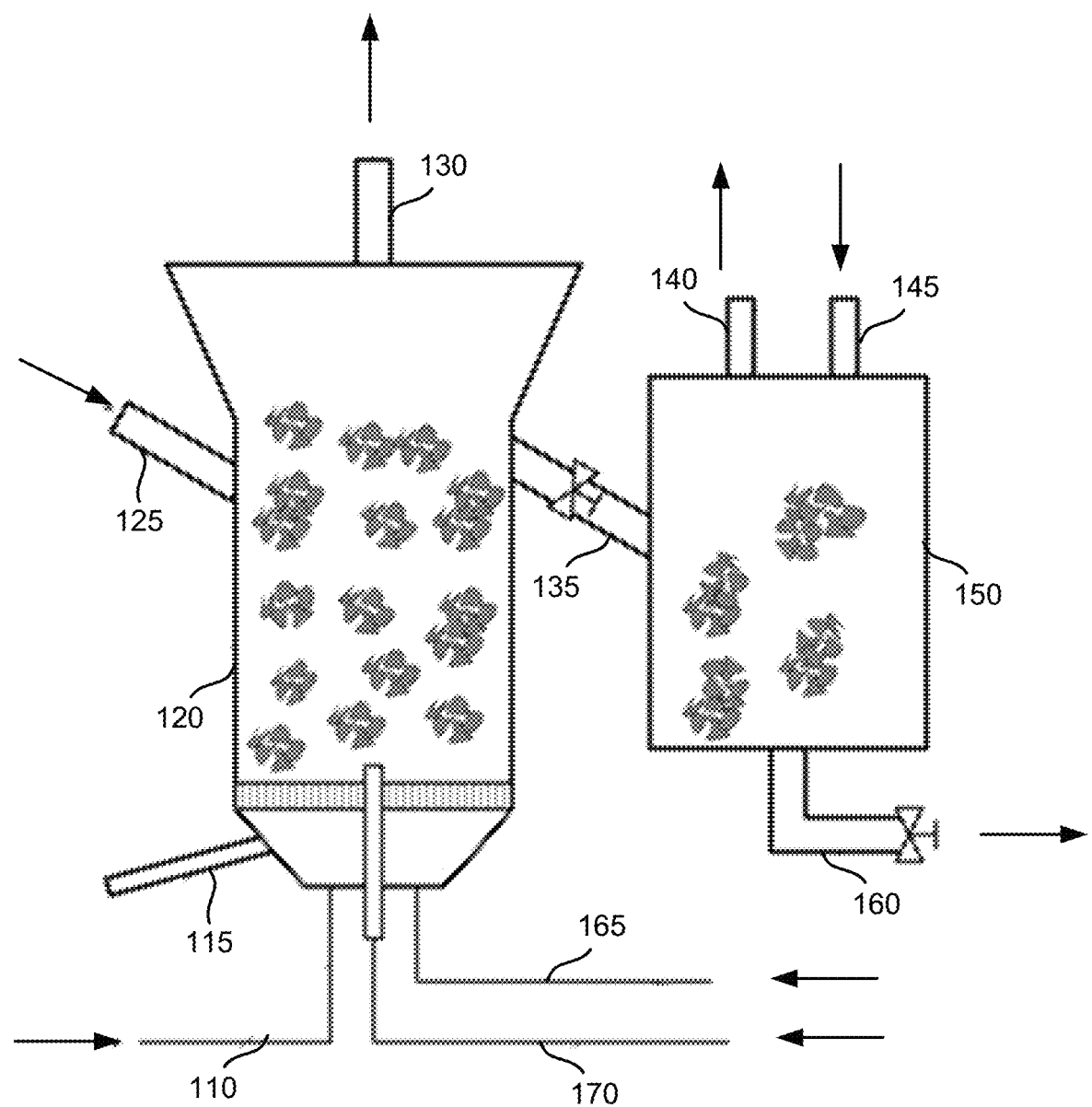
FIG. 1 illustrates a block diagram of an apparatus for producing silicon-carbon composites.

FIG. 1 illustrates a block diagram of an apparatus for producing silicon-carbon composites. The apparatus includes a fluidized bed reactor 120 and a reservoir 150. Reactor 120 includes a reactive gas input 110, a gas purging input 115, a carbon solid input 125, an effluent gas output 130, a connection mechanism 135 between reactor 120 and reservoir 150, a vacuum line 140, purge gas input line 145, a composite output 160, a fluidization gas input 165, and silicon precursor gas input 170. The reactor and reservoir may implement a semi-continuous process to produce a silicon-carbon composite and control the silicon morphology in the graphite/graphene and their derivatives to avoid the over growth of resulting silicon particles.

The reactor 120 and reservoir 150 may be controlled completely or in part by one or more computer devices. The computer control of all or part of the process performed by the reactor 120 and reservoir 150 allows the process to be more accurate and more efficient that a process performed entirely manually. Though not illustrated in the system of FIG. 1, the reactor 120 and reservoir 150 may both be communicatively coupled and controlled by one or more computers. Additionally, each of the steps discussed with respect to FIG. 2 may also be performed or controlled by one or more computers communicatively coupled to and/or controlling reactor 120 and reservoir 150.

Figure 2:
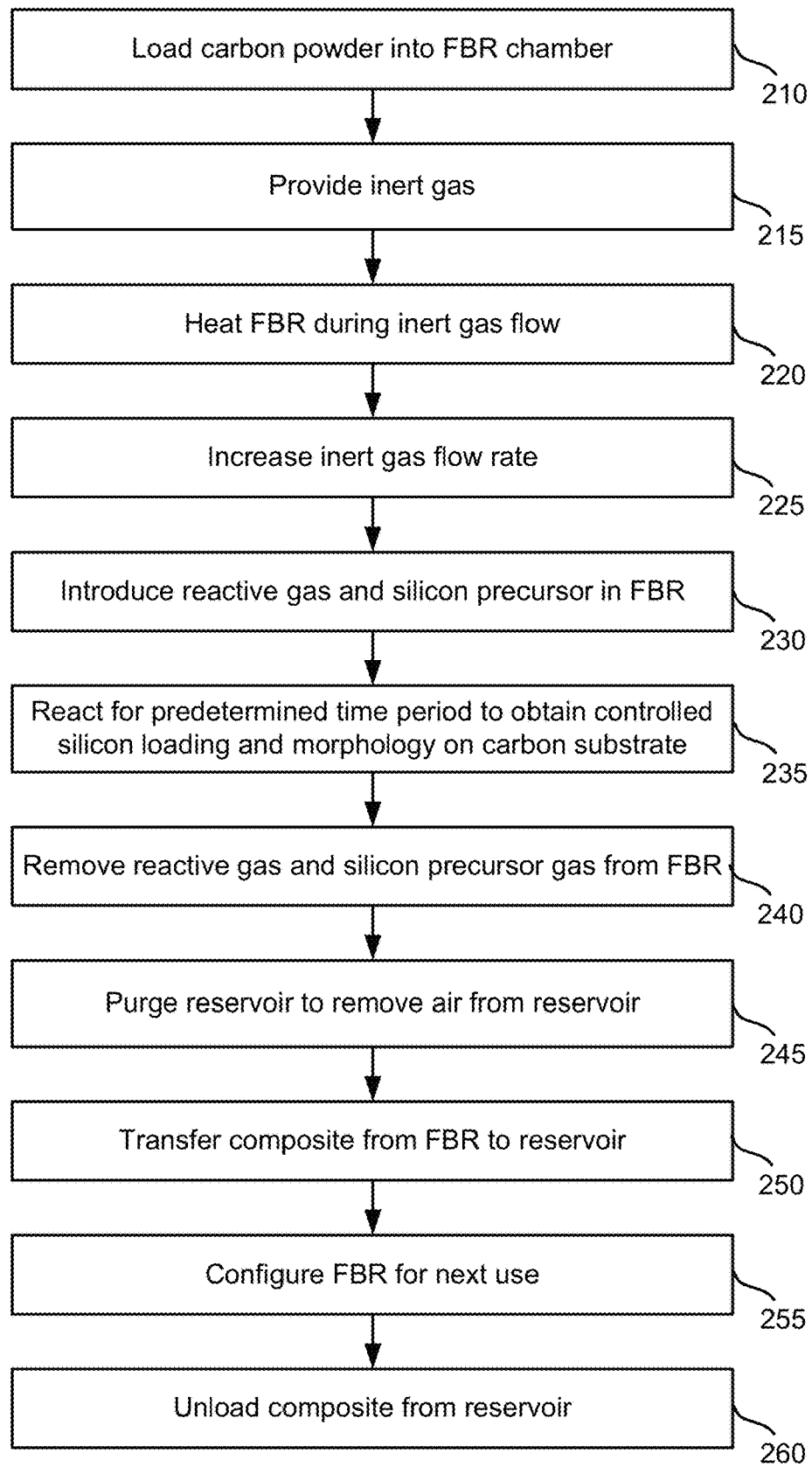
FIG. 2 illustrates a method for generating a silicon-carbon composite.

FIG. 2 illustrates a method for generating a silicon-carbon composite. The method may produce silicon-carbon composite on a semi-continuous basis and may be implemented by the apparatus of FIG. 1. Carbon powder is loaded into the FBR at step 210. The powder may be loaded into a chamber of the FBR through carbon solid input 125.

Inert gas may be provided at step 215. The inert gas may be provided through fluidization gas input 165 to remove any trace amounts of air inside the chamber. The FBR may be heated during the inert gas flow at step 220. The heating may be performed to a desired temperature, such as for example 800-1000 degrees Celsius. The inert gas flow rate may be increased at step 225. The gas flow rate is increased to fluidize the carbon power to achieve a stable fluidization status.

Reactive gas is introduced as well as a silicon precursor gas at step 230. The reactive gas is introduced through the reactive gas input 110 while the silicon precursor gas is introduced through the silicon precursor gas input 170. The introduced gases cause a decomposition of silicon gas precursor into a solid silicon reaction.

A reaction occurs for a predetermined period of time at step 235. The reaction occurs to obtain controlled silicon loading and morphology on a solid carbon substrate. The carbon substrate may include a silicon-carbon composite or tin-carbon composite. The reactive gas and silicon precursor gas are removed from the FBR at step 240. Removing the gases may include shutting-off the reactive gas and silicon precursor gas, allowing sufficient time to remove all the reactive gas and silicon containing gas from the FBR chamber. The reservoir is purged to remove air from the reservoir at step 245. Vacuum line 140 and purge gas input line 145 are used to purge the air from the reservoir. The composite is transferred from the FBR to the reservoir at step 250. The composite is transferred via connecting mechanism 135. The connecting mechanism may include a tube, pipe, or other structure for allowing the composite to be moved from the FBR to the reservoir. The transfer is implemented by closing the effluent gas outlet, pulling vapor through vacuum line, and purging gas from purge lines 115, and 165.

The FBR is configured for the next use at step 255. The configuration may include, after all composite has been removed from the FBR chamber, closing the connecting mechanism. The composite is then unloaded from the reservoir at step 260. The composite may be unloaded after it has cooled down to room temperature.

The present technology utilizes the reservoir to host the produced composite at high temperatures and allows it to cool to room temperature under inert gas protection, either in a static or a fluidized bed. The reservoir frees the FBR chamber from hosting the composite during its cooling down periods, which is a lengthy period, thereby allowing semi-continuous use of the FBR chamber to produce the composite.

An inert gas airlock may be used to protect the valve connecting the FBR reactor with other parts, which exposes chlorine containing gases to high temperature and the need to move for on and off.

In some instances, the present technology may be utilized with one or more computing systems. The computing systems may be specific to the present FBR and reservoir and serve to provide an improved composite in a semi-continuous process. For example, the apparatus may employ specially designed monitoring system to observe the fluidization and emptiness of composite inside the FBR. The computing system may be implemented by the system of FIG. 3.

In some implementations, feed material ("Grid") may be semi-continuously fed as a powder into a pressurized vessel. Grid may include graphite/graphene and its derivatives, and is fluffy, cohesive, and easy to agglomerate. Grid can be difficult to transport into a pressurized vessel without agglomerate. The present technology achieves this goal via, for example, a screw, auger process, a pneumatic approach, and a multistage feeding vessel.

Graphite/graphene, its derivatives and other similar Graphitic-like materials suitable for use in a CVD process of the present technology have a small particle size and thus are considered Geldart Type C particles. The particle size graphene and derivatives are fluffy, cohesive, and tend to pack and compact while handling. This makes conventional feeding mechanisms for use in feeding the graphite and derivatives to silicon deposition reactors such as lock hoppers, screw feeders and rotary feeders prone to jamming. The present technology, however, includes novel processes for using these reactors with graphene and derivative materials.

Screw feeders of the prior art can be open or enclosed, wherein enclosed feeders have been used to feed powder against a pressure gradient by forming an airtight compacted plug. Tests showed this can be achieved but the plugs formed are very difficult to break up in the fluidized bed. Thus, this technique is not usable without some additional plug breaking device. Both open and enclosed screw feeders can be used to feed between vessels without a pressure gradient because the plug is not needed however such feeders are then similar to rotary feeders which provide control of the flow but not a pressure seal.

Rotary Airlock feeders of the prior art can be used to provide a pressure seal but have a leak rate that is usually unacceptable for addition of seed silicon to silicon deposition reactors. The leak rate is unacceptable because of the use of flammable and toxic gases. The deposition reactor of the present technology, in some implementations, can be fed between cycles when the reactor is empty and operating on nitrogen. Therefore, a rotary feeder is usable, both in an apparatus and a process of the present technology, because the seal is not provided by compacted graphitic material but by an elastomer. However, flexible elastomers are temperature sensitive and the reactor of the invention operates at high temperature during deposition. As a result, design techniques such as cooling, a purge gas flow and/or additional valves can be implemented to protect the seals from the hot gases of the reactor during operation.

Also in the prior art, various pneumatic types of feeders are used to blow solids into pressurized reactors including silicon deposition reactors. Such feeders need to use a gas such as hydrogen which is compatible with the gases in the reactor, which means that for safety reasons additional nitrogen purging gas must be used to remove the hydrogen before the system can be opened to the air for refilling. As noted above, the semi-continuous nature of the present technology, in some implementations, allows the use of only nitrogen during the filling process so a pneumatic feeder would not require both hydrogen and nitrogen supply. The resulting pneumatic feeder would be simpler to use than in prior art silicon deposition reactors. Such feeders can have a conical bottom section which directs the solids flow into the pneumatic transfer tube and the graphitic material compacts in the cone thus forming plugs. Thus, to use a pneumatic feeder, a positive feeding mechanism such as a screw feeder or rotary feeder can be used.

Multistage feeding vessels or lock hoppers are a very common means of feeding solids into a pressurized reactor and rely on two gas tight seals. One between the reactor and the reactor feeding vessel and one between the reactor feeding vessel and the solids receiving vessel, which is periodically opened to atmosphere. Maintaining these seals is difficult because of the solids passing through and the flammable and/or toxic gases in the reactor. Usually a multi gas purging system as with the pneumatic feeders is required. This multi gas purging system is not required with the semi-continuous process of the present technology because of the semi-continuous nature and the ability to safely open to atmosphere to fill with solids, while the reactor is in its emptying portion of the semi-continuous cycle and is operating on nitrogen.

Figure 3:
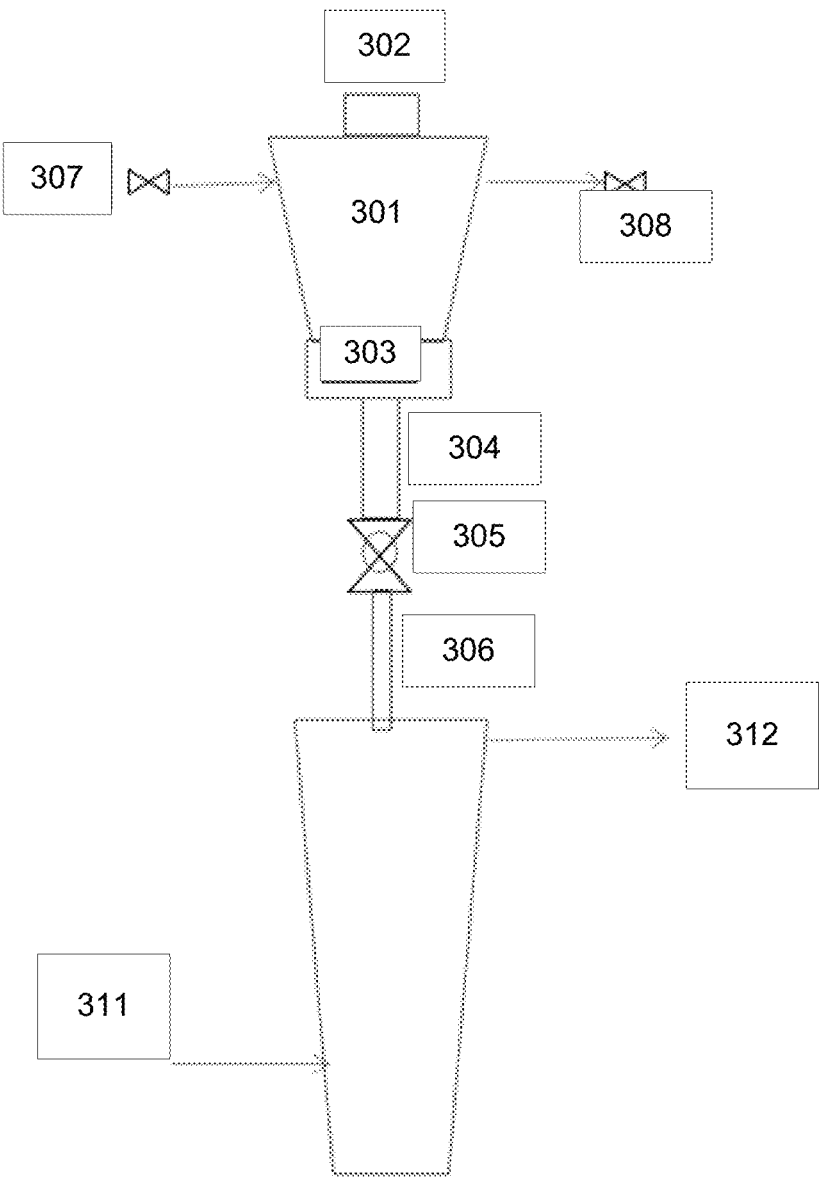
FIG. 3 illustrates a block diagram of an apparatus for performing a semi-continuous CVD process.

FIG. 3 illustrates a block diagram of an apparatus for performing a semi-continuous CVD/thermal deposition process. A vessel, 301, with a closable opening, 302, is provided with a solids feeder, 303, a conduit 304, a gas tight valve, 405, and a conduit 306 which connects to the reactor 310.

The reactor 310 is also provided with a gas inlet 311 and gas outlet 312. The reactor 310 is operated cyclically in a semi continuous way during which there is a part of the cycle when it is beneficial to operate the filling mechanism. This cycle portion occurs where the deposition has been stopped and the solid particles inside the reactor are being fluidized by an inert gas such as nitrogen, which flows in through entrance 311 and out through exit 312. At this time, the gas tight valve 305 is closed, the solids feeder is closed and the purge nitrogen is allowed to flow through line 307 into the chamber 301 and out to the vent through line 308. After purging the vent line 308 and nitrogen line 307 is closed, the top opening 302 is opened and the graphitic material is poured in. The opening 302 is closed and the vent line 308 is opened and the nitrogen flows in through line 307 and outline 308. Lines 307 and 308 are closed to isolate the chamber 301. Once the reactor has been emptied of product, new material may be placed into the reactor. First gas tight valve 305 is opened then the solids feeder, 303 is started to feed the new material at a controlled rate into conduit 306 and then into the reactor. The solids flow is controlled so that the conduit 306 does not back up, which could cause plugging. The maximum solids flow is determined by the diameter of the conduit at the smallest restriction.

After performing a semi-continuous CVD process, the resulting silicon-graphene composite product may be removed and separated from raw material. The resulting silicon-graphene composite has similar physical morphology as the starting graphene, so it would be nearly impossible to separate them using approaches typically used in polysilicon production.

After deposition, the silicon-graphene composite has silicon distributed within it but the external morphology and particle diameter remains largely unchanged. In contrast, in the prior art of continuous silicon deposition on silicon particles, the seed silicon particles, which are added or generated by grinding, grow in diameter. Thus, seed silicon particles which have been in the reactor a long time have received a lot of silicon deposition, are large, and can be separated from silicon particles that have less deposition by separation techniques based on particle size, such as for example by sieving or segregation by selective fluidization. Examples of sieving in the prior art are described in U.S. Pat. No. 6,827,786, titled "Machine for production of granular silicon" (the '786 patent), which shows a silicon sieve as item 14 in FIG. 1a. An example of fluidized separation is shown in U.S. Pat. No. 4,818,495, titled "Reactor for fluidized bed silane decomposition," (the '495 patent) in which FIG. 4 which shows a separator 18 and a collector 20.

These separation techniques are not useful for the resulting silicon-graphene composite because there is no useful correlation between silicon deposition in the reactor and particle size. The useful properties of the silicon composite depend on the ratio of silicon to graphene in the individual particles, not in the ratio in the bulk material. Thus, the deposition of silicon per granule must be carefully controlled to avoid wide disparities between granules which would lead to problems in the use of such granules in the fabrication of battery electrodes. Batch processing of the graphite/graphene and their derivatives should proceed such that each particle has the same deposition exposure time.

Implementations of the present technology remove product from the FBR. Methods to remove the product from the FBR include but are not limited to blow out from the apparatus, discharge from the bottom using pulsed gases, and special valves made by SML associates locates in Encinitas, Calif.

In the prior art of silicon deposition on silicon particles there are various means for removing the silicon particles. These can be separated into techniques which can remove the entire bed of particles and those which remove a portion of the bed. Because of the need for batch processing of the graphene and its derivatives, only those that remove the entire bed can be used for silicon-graphene composite removal.

In some implementations, a FBR may include a reactor, one or more inlet coolers, a bead and gas heater, and a bead cooler. Generated products may be removed from the bottom through a bead cooler into a silicon sieve. Since the removal is at the bottom, the entire bed of particles can be removed through the bead cooler. In some implementations, is not desired to selectively remove part of the bed and recycle it, so a sieve is detrimental and can be removed. Similarly, the product can also be removed from the bottom but it is not desired to selectively remove only the large particles of the bed as product, so the separator can also be removed. Thus a FBR of the present technology that provides for removal of silicon-graphene composite product from or near the bottom of a chamber can also be used for removal of the silicon-graphene composite, for example by removing the entire bed of material.

Certain techniques for removal of silicon-graphene composite material from or near the top of an FBR, are not suitable for removal of Silicon-graphene product as part of a continuous process. A continuous top removal technique cannot be modified to provide continuously complete bed removal. However with the semi-continuous process of the invention it is possible to use a semi-continuous overhead removal design by removing the fines during the deposition portion of the cycle and handling them separate from the product which is then blown over at the end of the deposition cycle by a large short term increase in the fluidizing gas.

While the concept of bottom removal is common in silicon deposition, the actual removal of the silicon-graphene composite product is considerably different from the removal of silicon product because of the different properties of the silicon-graphene composite material. In particular, silicon-graphene composite has greater cohesiveness, tendency to agglomerate and lower density. As such, they silicon graphene composites react differently and behave differently, and cannot be effectively removed for techniques designed for a material such as silicon particles. As such, typical FBR bottom removal mechanisms, as well as top removal mechanisms, are not suitable to separate silicon-graphene composite material.

Any bottom removal of product requires a conduit of some kind, located at the bottom of the FBR chamber, connected to a container of some kind. This conduit must have an upward flow of gas which is sufficient to prevent the down flow of solids during deposition, but may be reduced to allow the down flow of solids when desired for removal. Various solutions have been proposed including providing a pipe which is both the reaction gas inlet and Particulate product removal, and use of an annular removal device and a separate pipe with an upward flow of the non-reacting gas hydrogen. The upward flow of gas must be heated in some way and dilutes the reacting gas in the reactor. As a result, it is desirable to use the minimum diameter possible and still obtain flow for solids. Other attempts at removal of the silicon-graphene composite material, for example through a product removal conduit, result in plugging the conduit.

Control of exit flow can be achieved by control of the pulsing gas on and off cycle and by its flow. It can be desirable to isolate the reactor during deposition, but problems exist in the abrasive nature of the silicon particles which necessitate special precautions such as purges and special modification. The requirement for purity in the prior art also restricts the use of metallic materials hence the use of ceramics such as quartz.

The temperature of the silicon-graphene composite material can be reduced in the reservoir of the present technology by cooling, unlike the prior art silicon deposition technology which does not have a reservoir per se. Cooling can be achieved using an annular removal device, which cools the product by heat exchange through the inner wall of the annulus to the incoming silicon reacting gas. Cooling can also be achieved by heat exchange to a water cooled jacket. Both of these methods can be used to cool the product as it leaves the deposition chamber for the reservoir since the incoming silicon deposition gas is close to the bead removal tube. Final cooling of the beads from the reservoir is more easily accomplished with the water cooled jacket approach.

In some implementations, the present technology uses a reservoir for cooling the product in a separate fluidized bed. This has several advantages compared to the prior art, which discloses systems typically restricted by the speed it can cool because of the limited surface area and the difficulty of cooling flowing solids which have significantly greater thermal mass and resistance to internal heat flow than fluids. In cooling a column of flowing solids, it is very common to have a very high temperature in the center and a low temperature at the wall, because the particulate solids have low conduction between particles. In contrast, a fluidized bed has much higher heat transfer to particles because the cool gas directly contacts all the outside area of the particle and the particles are physically moved about to contact the walls. Thus, the present technology of a separate reservoir for cooling as a fluidized bed has the advantages that it is inherently much faster and can use conventional fluidized bed heat exchange technology such as cooled walls and cooled internals, which are typically coils. Since the silicon-graphene composite product is not sensitive to metal contamination, the reservoir can be made of metal which greatly simplifies the construction and reduces cost of an FBR. The reservoir can be designed with cooled walls and internals which also protects the walls against high temperature silicon-graphene composite material coming from the deposition reactor. It is feasible to recover valuable heat from such a system, even though the cooling is semi-continuous by using storage of a heat medium or by operating multiple reactor reservoir systems out of phase with each other. In the prior art silicon deposition on silicon systems heat recovery is acknowledged to be desirable but is difficult to implement. In systems of the prior art, the product can been carried over to the cyclonic cooler, but removing the heat is challenging because purity restrictions make a ceramic such as quartz necessary to contain the particles, and such ceramics do not have sufficient strength to use as pressure vessels However, with the silicon-graphene composite material, the abrasion is much reduced and metallic corrosion is not an issue so conventional valves can be used. In some implementations, to avoid plugging of the valves and plugging the inlet line to the valves if the upward gas flow is completely shut off by the valve, two valves with a purge between them can be used. A top valve may be a solids control valve which permits upward gas flow but prevents downward solids flow. The second valve can seal against the gas flow. This allows the safe removal of the product container from under the product reservoir while the reservoir is at operational pressure. Various valves are suitable for the solids flow control valve such as slide valves, pinch valves or rotary valves. The gas control valve can be selected from a range of similar valves such as plug and ball valves that allow free flow of solids through the valve when open and seal against gas pressure when closed. It has been discovered that a ball valve with elastomeric seats is a good choice.

In some implementations, the formed composite has a similar density and morphology to the starting solid materials, so it is difficult to separate the composite material with the starting materials through approaches used in polysilicon production.

Figure 4:
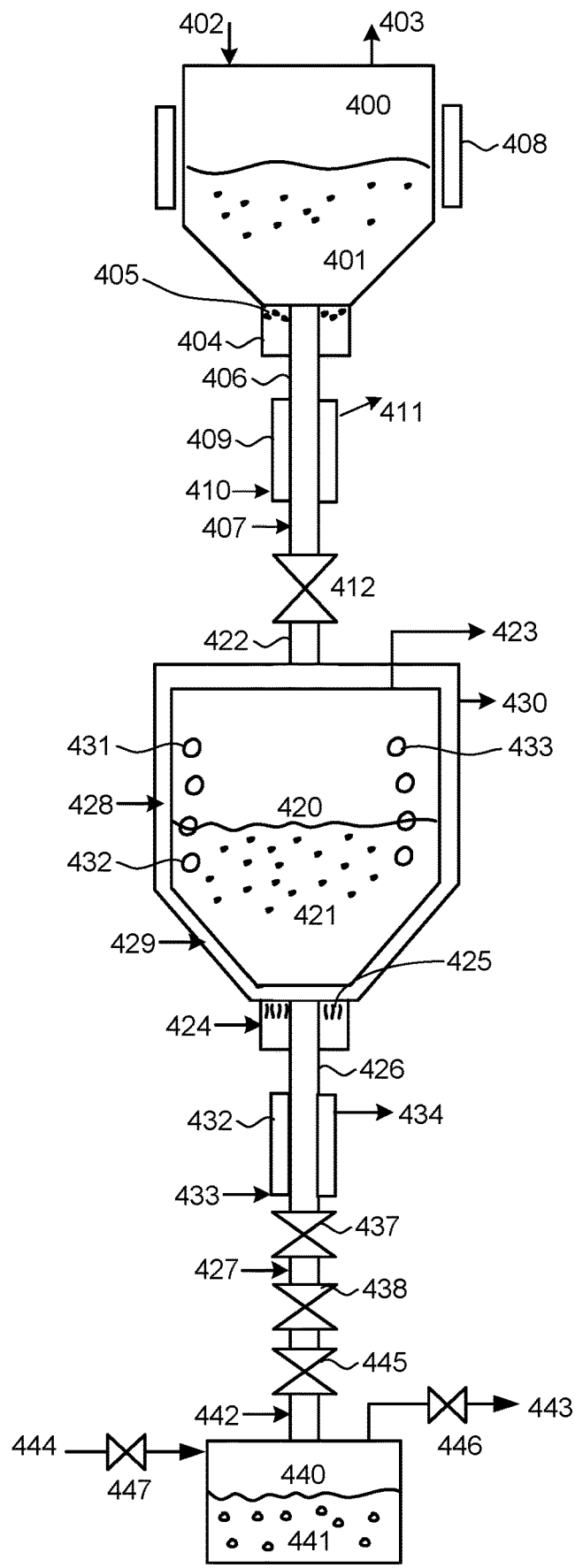
FIG. 4 is a block diagram of a reactor for performing a semi-continuous deposition process.

FIG. 4 is a block diagram of a reactor for performing a semi-continuous deposition process. The deposition reactor, 400, is a vessel containing a particle bed, 401, with a solids inlet, 402, gas outlet, 403, a gas inlet, 404, a gas distributor, 405, and a solids outlet, 406. It is heated by external heaters, 408. The operation of the deposition reactor, 400, is cyclical. At the beginning of the cycle and inert gas flow, such as nitrogen, is initiated through the gas inlet, 404, which then flows upward through the gas distributor, 405, into the container. A further gas flow is initiated upward from the solids purge line, 407, up through the solids outlet, 406, to prevent solids falling down the solids outlet. Solids are introduced into the deposition reactor, 400, through the solids inlet, 402, to form a particle bed, 401. Once the bed is formed, the solids feed is discontinued and the two inert gas flows are transitioned to hydrogen at a sufficient flow rate to fluidize the particle bed, 401, and the heaters, 408, are used to raise the bed temperature to the desired deposition temperature of 800-1000 C. The initial hydrogen flows are reduced as the bed temperature increase to maintain fluidization at the desired agitation level.

After the deposition temperature and hydrogen flowrates are established, a silicon deposition gas, such as for example monosilane, SiH4, or Trichlorosilane, SiHCl3, is added to the hydrogen flow entering through the gas inlet, 404. Deposition then proceeds for as long as is necessary to obtain the desired amount of deposition. Deposition may proceed, for example, from half to five hours. To terminate the deposition, the silicon deposition gas is removed from the hydrogen entering through gas inlet, 404 and further hydrogen is added as necessary to maintain fluidization. The material in the particle bed has now been deposited with silicon and is ready to be moved to the reservoir, 420. Before this transfer occurs, the cooling flow must be established through the outlet jacket cooler, 409, by flowing coolant in through the coolant inlet, 410 and out through the coolant outlet 411.

The reservoir, 420, is a vessel containing a particle bed, 421, with a solids inlet, 422, gas outlet, 423, a gas inlet, 424, a gas distributor, 425, and a solids outlet, 426. It is cooled by an external jacket, 428 and by internal coils, 431. The operation of the reservoir, 420, is also cyclical. At the beginning of the cycle, a non-reactive gas flow, such as hydrogen, argon or nitrogen, is initiated through the gas inlet, 424, which then flows upward through the gas distributor, 425, into the vessel, 420. A further gas flow is initiated upward from the valve purge line, 427, and up through the solids outlet, 426, to prevent solids falling down the solids outlet. Before this solids transfer, the cooling flow must be established through the reservoir jacket cooler, 428, by flowing coolant in through the coolant inlet, 429 and out through the coolant outlet 430 and the reservoir internal coils 431, by flowing coolant in through the coolant inlet, 432 and out through the coolant outlet 433.

The next step is the introduction of solids from the deposition reactor, 400, through the solids inlet, 422, to form a particle bed, 421. Once the deposition reactor 400 is empty, the solids feed is discontinued and the two inert gas flows are transitioned to a sufficient flow rate to fluidize the particle bed, 421, and the cooling jacket, 428, and cooling coils, 429, are used to reduce the bed temperature to the desired outlet temperature of 10-150° C. The initial gas flows are increased as the bed temperature decreases to maintain fluidization at the desired agitation level. After the desired temperature is reached, the solids are ready to be transferred to the product container 440. Before this transfer, the cooling flow must be established through the outlet jacket cooler, 434, by flowing coolant in through the coolant inlet, 435 and out through the coolant outlet 436 and the product container, 440, must be ready to receive solids. The product container, 440, is a gastight vessel containing a particle bed, 441, with a solids inlet, 442, gas outlet, 443, a gas inlet, 444. To receive solids beginning of the cycle an inert gas flow, such as, argon or nitrogen, is initiated through the gas inlet, 424, which then flows through upward the vessel, 440 and out the gas outlet 443. The solids flow is initiated by first opening the gas tight valve, 438, then opening the solids valve 437 and the solids isolation valve, 445, if provided. The solids flow into the product container 440 until the desired amount has been transferred then the solids valve, 437 is closed and then the gas tight valve 438 is closed. The product material may then be purged for some time by flowing the inert gas through gas inlet, 444, and out the gas outlet, 443. If it is desired to maintain the material under an inert gas blanket then isolation valves are provided on the container. Such valves are shown as solids isolation valve, 445, gas outlet isolation valve, 446 and gas inlet isolation valve, 447. These valves, 445, 446 and 447 are then closed and the connections to the valves are disconnected and the product container is removed and replaced with an empty container.

In some implementations, the semi-continuous process may be implemented as a multistep process. This can be implemented in various ways. An initial pair of deposition and reservoir vessels can be followed by one or more pairs of deposition and reservoir vessels. In such an operation, a portion of the deposition would occur in the first vessel then the reservoir vessel would cool the initial product, transfer it to a second deposition reactor to continue the deposition, and a second reservoir would cool the material. The transfer between vessels causing mixing and some breaking of agglomerations would be beneficial in proving more uniform fluidization and deposition in a subsequent step. In some implementations, additional devices can be provided, such as sifters between the vessels, to provide additional break up of agglomerates and a more uniform particle size. Some types of devices to accomplish the breaking of agglomerates may require a cooled material, and would thus be placed after the initial reservoir.

Figure 5:
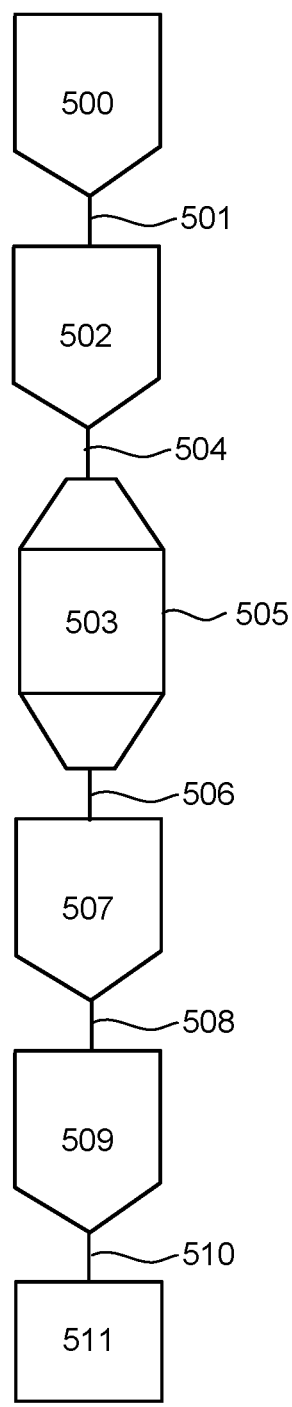
FIG. 5 is a block diagram of a vessel with multistep capability.

FIG. 5 is a block diagram of a vessel with multistep capability. For purposes of illustration and example, the vessel of FIG. 5 is illustrated without all components typically implemented within such a vessel, such as the in and out connections illustrated in the block diagram of FIG. 4.

Vessel 501 is a first deposition reactor and is connected by conduit 502 to the first reservoir vessel 503. First reservoir vessel 503 has an outlet conduit 504. Vessels 501, 503 and conduits 502 and 504 resemble the semi-continuous block diagram of FIG. 4 Rather a product container as in FIG. 5, however, the vessel of FIG. 5 includes a de-agglomerating device 505. The de-agglomerating device which include a sifter or any other device capable of breaking up agglomerates which can form during deposition and handling. The de-agglomerating device can act to breaks up the agglomerates and also mixes the solids. The de-agglomerated and mixed solids then proceed via conduit 506 to the second deposition reactor 507. At the second deposition reactor, further deposition occurs. The solids then proceed via conduit 508 of the second reservoir 509 for final cooling and discharge via conduit 510 to product container 511.

A vessel for multistep deposition has the advantage of mixing and de-agglomerating the silicon-graphene composite part way through the deposition process which improves the quality control of the deposition, particularly with respect to the silicon to graphite ratio and the particle level. It may be particularly advantageous in making silicon-graphene composite particles with high silicon to graphite ratios, which have desirable properties for battery electrodes.

In multistage designs, the initial deposition step is for a portion of the desired deposition. The partially processed material is removed to the reservoir and then fed to another deposition reactor stage for further deposition. Such a multistep process has advantages in closer control of the deposition and approaches a more continuous process which is beneficial for scale up.

Figure 6:
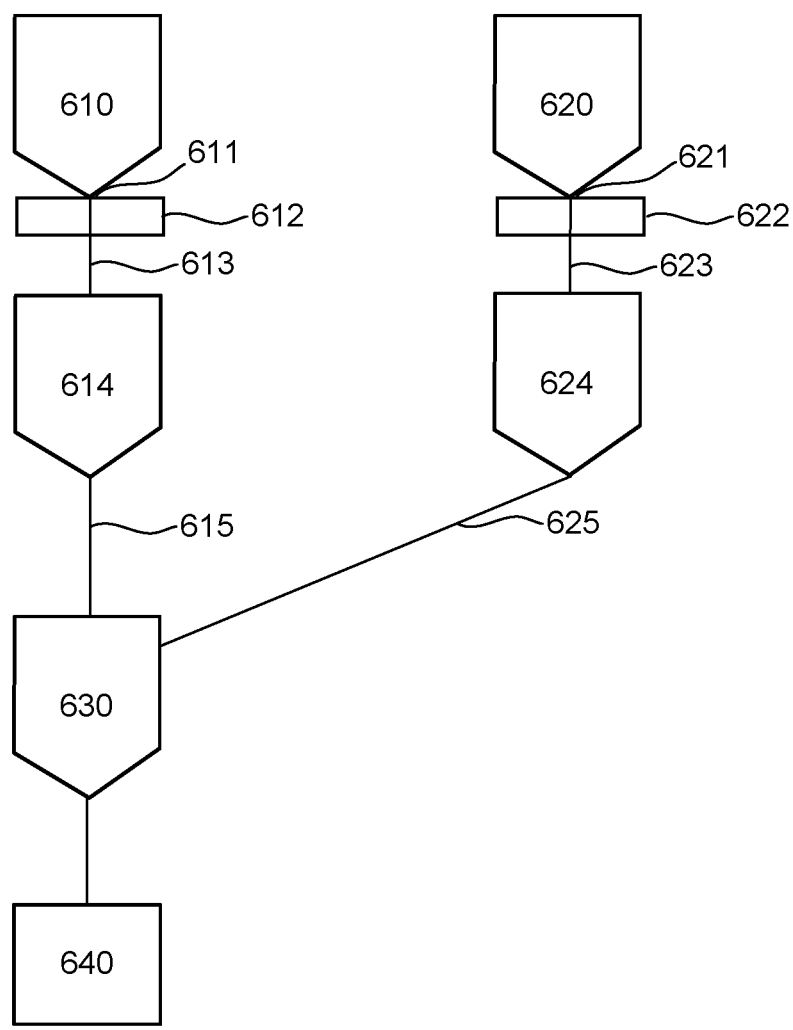
FIG. 6 is a block diagram of an alternate vessel with multistep capability

The reservoir of the first stage can also serve as the deposition reactor of the second stage. Multiple deposition stages can provide hot silicon-graphene composite product to a single reservoir stage. In such a design, the devices to provide the breaking of agglomerates after deposition would have to function at high temperature. Such a multistage system can be integrated into a single vessel for the multistage reactor followed by a final product reservoir. FIG. 6 is a schematic diagram which illustrates two of these possibilities.

FIG. 6 is a block diagram of an alternate vessel with multistep capability. It is also possible to have other different combinations of the basic semi-continuous process which maintain the quality benefits of a batch deposition but provide a more continuous production of the cooled silicon-graphene composite product. While it is not possible to illustrate all the possible combinations FIG. 6 illustrates two basic combinations and persons knowledgeable in the art can derive other combinations.

FIG. 6 is a schematic of a multistep application of the semi-continuous process using a high temperature de-agglomeration device. The high temperature de-agglomeration device is positioned between two deposition reactors in series. The high temperature de-agglomeration device is in place of a cooling reservoir and low temperature de-agglomerate utilized in FIG. 5 combined with use of parallel deposition reactors feeding into a single reservoir. For clarity in understanding the layout of a multistep process the vessels are shown without all the needed in and out connections which are shown in FIG. 5.

Vessel 610 is the first deposition reactor which is connected by conduit 611 to the first de-agglomeration device 612 which has an outlet conduit 613. This step breaks up the agglomerates and also mixes the solids without the cooling normally provide by the reservoir. The de-agglomerated and mixed solids then proceed via conduit 613 to the second deposition reactor 614 where further deposition occurs. The solids then proceed via conduit 615 to the sole reservoir 630. At sole reservoir 630, a final cooling occurs as well as discharge via conduit 631 to product container 640. In parallel to these deposition reactors are a third deposition reactor 620, a second de-agglomerator 622, and a fourth deposition reactor 624. Deposition reactor 620 is the third deposition reactor which is connected by conduit 621 to the first de-agglomeration device 622 which has an outlet conduit 623. This step breaks up the agglomerates and also mixes the solids without the cooling normally provided by the reservoir. The de-agglomerated and mixed solids proceed via conduit 623 to the fourth deposition reactor 624, where further deposition occurs. The solids then proceed via conduit 625 to the sole reservoir 630 for final cooling and discharge, via conduit 631, to product container 640.

As shown in and discussed with respect to FIG. 6, implementations of the present technology separates the deposition into two or more reactors in series, which may be connected with a de-agglomeration device and then followed by a reservoir to cool the final Silicon-graphene composite product. Implementations of the present technology can also have two or more deposition reactors in parallel that each produce the same Silicon-graphene composite product and discharge the product it into a common cooling reservoir. If the cycles of the parallel reactors are controlled to be out of phase with each other, then it is possible to feed the reservoir on a more continuous basis and stabilize the cooling cycle so it is more continuous, thereby able to be both a consistent source of recovered heat and a steady supplier of cooled product. In some implementations, the reservoir cooler can be separated into more than one vessel which might be advantageous for heat recovery.

In a multistage reactor for Polysilicon production, the first reactor typical is for polysilicon deposition at low temperature (600° C. to 700° C.), followed by post treatment at high temperature to crystallize it in second stage reactor. The hydrogen content of polysilicon can be reduced by heat treatment. The process is preferably conducted on polysilicon particles in bead-like form produced by chemical vapor deposition in a fluidized bed. The heat treatment is preferably conducted at a temperature of 1020°-1200° C. for a time from about 6 hours to about 1 hour sufficient to reduce the hydrogen content, and insufficient to cause agglomeration of the particles being treated. In order to reduce the tendency of particles to agglomerate at the process temperature employed, the particle bed is preferably maintained in motion during the dehydrogenation. The products produced by the process can have a hydrogen content of 30 ppma or less. These improved products can be used to produce monocrystalline silicon for the production of semiconductor devices.

Figure 7A:
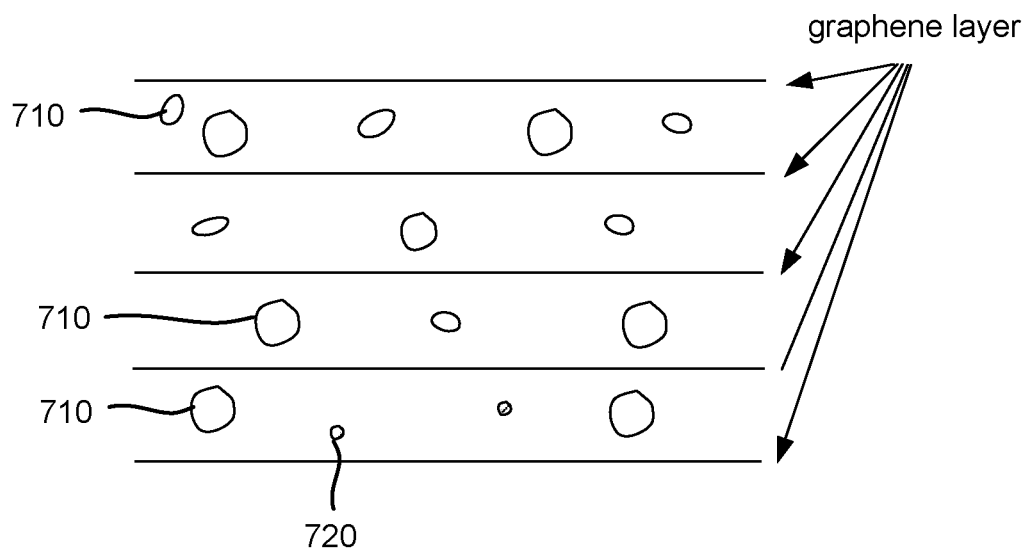
FIG. 7A illustrates a silicon graphene microstructure.

FIG. 7A illustrates a silicon-graphene composite microstructure. The microstructure of FIG. 7A includes graphene layers 710 and silicon particles 720. The silicon island particles (i.e., silicon particles) may be embedded within gaps formed by the graphene layer. The silicon particles may be uniformly dispersed, bonded and embedded in the graphene matrix formed by graphene layers 710. The silicon island particles may have dimensions of between 2 nm to 2 microns long. Hence, the composite structure includes a nano-composite. The plurality of graphene layers and plurality of silicon particles form an embedded conductive matrix. In the microstructure of FIG. 7A, the illustrated portion of the microstructure may be about 10 microns long. In some implementations, a blob or other portion of the silicon graphite microstructure can have a size in the range of 0.05-40 microns long. The illustration of the silicon particles between the graphene layers are not to scale, and may be smaller or larger in size than the scale shown in FIG. 7A. The silicon graphene composite microstructure of FIG. 7A, and the macrostructure of FIG. 7B, may be formed by a fluidized bed reactor and may be utilized in an electrochemical device, such as a battery, battery cell, or other power source.

Figure 7B:
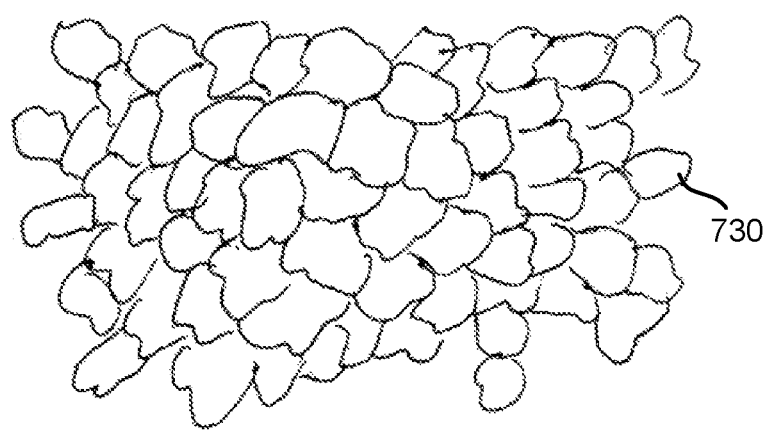
FIG. 7B illustrates a silicon graphene macrostructure.

The silicon-graphene microstructure may form a macrostructure as shown in FIG. 7B. The silicon-graphene macrostructure may form a shape from several crystal like groups of silicon-graphene composite material. The silicon graphene macrostructure forms a secondary structure of agglomerated silicon-graphene composite. In some implementations, the silicon-graphene macrostructure may be formed in ball-like shapes or blobs having a diameter of 5-100 microns. In some implementations, the silicon graphite macrostructure may be formed in ball-like shapes or blobs having a diameter of 2-40 microns. The plurality of graphene layers with embedded silicon particles can form one or more blobs of coupled and conductive material. The silicon-graphene macrostructure can be formed the trolling up of large two dimensional silicon-graphene sheets into a ball-like structure or blob. The composite structure forms an agglomerated silicon-graphene composite particles.

Figure 8A:
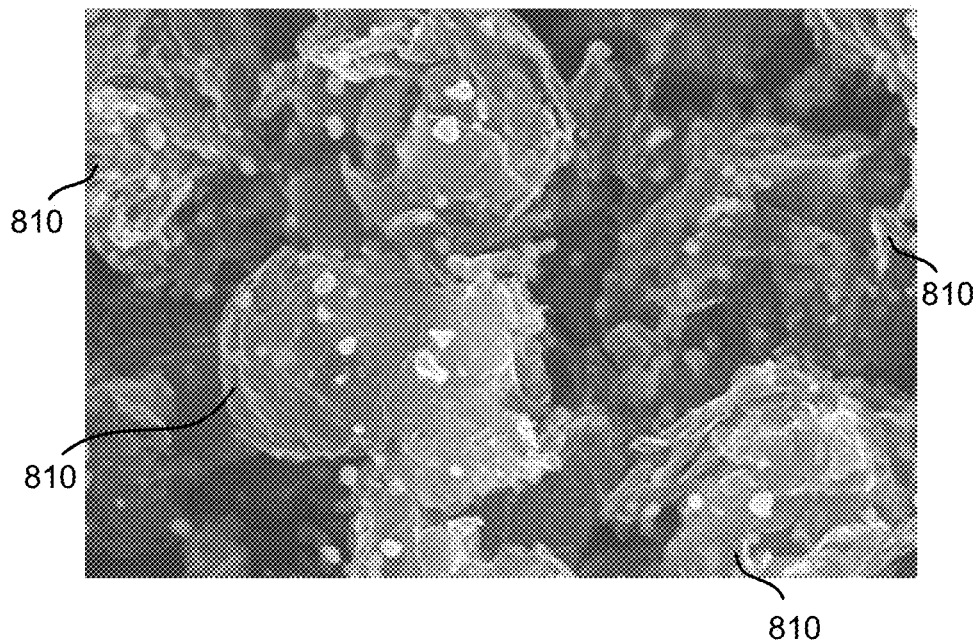
FIG. 8A is an illustration of a silicon-graphene composite generated by an FBR reactor.
Figure 8B:
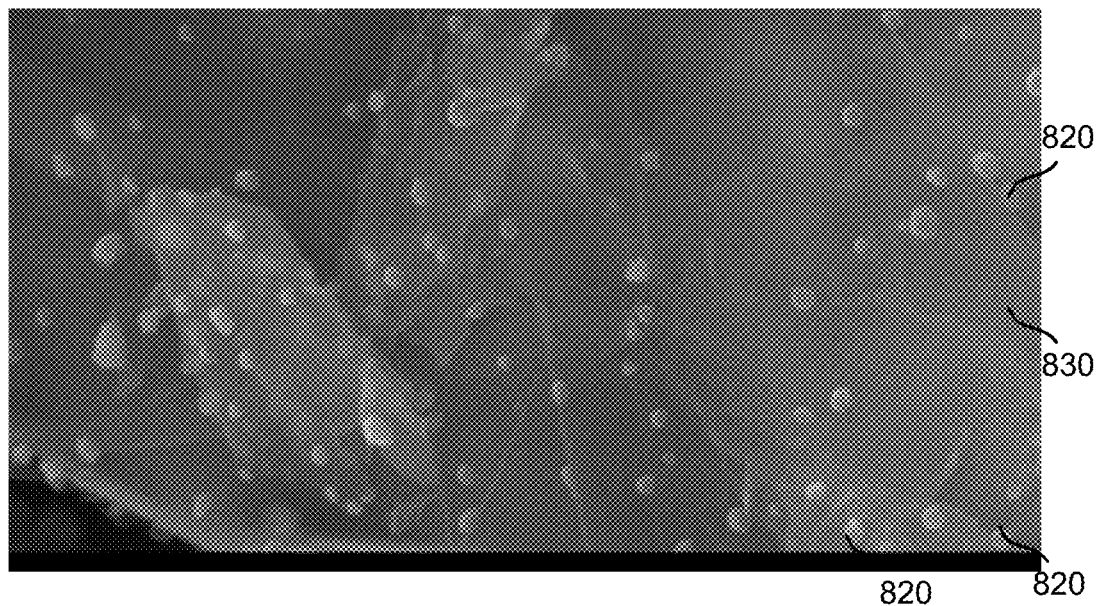
FIG. 8B illustrates another silicon-graphene composite generated by an FBR reactor.

In some implementations, the unique silicon-graphene composite described herein possess a strong bond force between silicon particles and the matrix. The particles in the matrix may include Silicon, or could also be one or more of Sn, Pb, Al, Au, Pt, Zn, Cd, Ag, Mg, or Mo, both in addition to or in place of silicon particles. The matrix materials can be conductive materials that are stable in a lithium battery environment include but not limited to carbonaceous, exfoliated sheet material FIG. 8A is an illustration of a silicon-graphene composite generated by an FBR reactor. The silicon-graphene composite is in the form of crystals 810 formed of a silicon-graphene microstructure. The microstructure includes silicon particles uniformly dispersed, bonded and embedded in a graphene matrix. The macro-structure of FIG. 8A also shows trolling up of two dimensional silicon graphene sheets into a ball-like structure. FIG. 8B illustrates another silicon-graphene composite generated by an FBR reactor. The silicon-graphene composite of FIG. 8B shows visible silicon particles 820 within layers of graphene 830.

Figure 9:
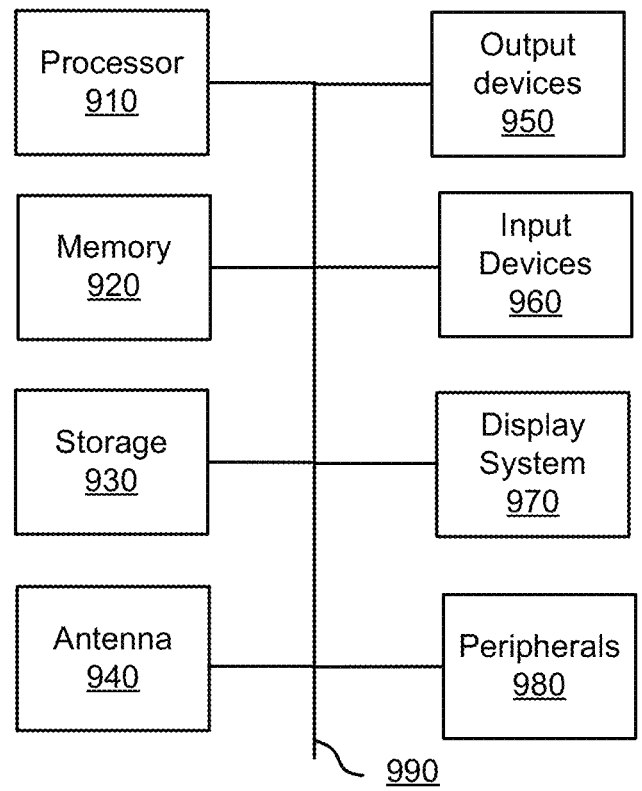
FIG. 9 illustrates a block diagram of a computing environment for use with the present technology.

FIG. 9 illustrates an exemplary computing system 900 that may be used to implement a computing device for use with the present technology. A computing device may be used with the vessels, to create particles, and automatically control the processes described with respect to FIGS. 1-8B. The computing system 900 of FIG. 9 includes one or more processors 910 and memory 920. Main memory 920 stores, in part, instructions and data for execution by processor 910. Main memory 920 can store the executable code when in operation. The system 900 of FIG. 9 further includes a mass storage device 930, portable storage medium drive(s) 940, output devices 950, user input devices 960, a graphics display 970, and peripheral devices 980.

The components shown in FIG. 9 are depicted as being connected via a single bus 990. However, the components may be connected through one or more data transport means. For example, processor unit 910 and main memory 920 may be connected via a local microprocessor bus, and the mass storage device 930, peripheral device(s) 980, portable storage device 940, and display system 970 may be connected via one or more input/output (I/O) buses.

Mass storage device 930, which may be implemented with a magnetic disk drive or an optical disk drive, is a non-volatile storage device for storing data and instructions for use by processor unit 910. Mass storage device 930 can store the system software for implementing embodiments of the present invention for purposes of loading that software into main memory 920.

Portable storage device 940 operates in conjunction with a portable non-volatile storage medium, such as a floppy disk, compact disk or Digital video disc, to input and output data and code to and from the computer system 900 of FIG. 9. The system software for implementing embodiments of the present invention may be stored on such a portable medium and input to the computer system 900 via the portable storage device 940.

Input devices 960 provide a portion of a user interface. Input devices 960 may include an alpha-numeric keypad, such as a keyboard, for inputting alpha-numeric and other information, or a pointing device, such as a mouse, a trackball, stylus, or cursor direction keys. Additionally, the system 900 as shown in FIG. 9 includes output devices 950. Examples of suitable output devices include speakers, printers, network interfaces, and monitors.

Display system 970 may include a liquid crystal display (LCD) or other suitable display device. Display system 970 receives textual and graphical information, and processes the information for output to the display device.

Peripherals 980 may include any type of computer support device to add additional functionality to the computer system. For example, peripheral device(s) 980 may include a modem or a router.

The components contained in the computer system 900 of FIG. 9 are those typically found in computer systems that may be suitable for use with embodiments of the present invention and are intended to represent a broad category of such computer components that are well known in the art. Thus, the computer system 900 of FIG. 9 can be a personal computer, hand held computing device, telephone, mobile computing device, workstation, server, minicomputer, mainframe computer, or any other computing device. The computer can also include different bus configurations, networked platforms, multi-processor platforms, etc. Various operating systems can be used including Unix, Linux, Windows, Android OS, iOS, and other suitable operating systems.

The foregoing detailed description of the technology herein has been presented for purposes of illustration and description. It is not intended to be exhaustive or to limit the technology to the precise form disclosed. Many modifications and variations are possible in light of the above teaching. The described embodiments were chosen in order to best explain the principles of the technology and its practical application to thereby enable others skilled in the art to best utilize the technology in various embodiments and with various modifications as are suited to the particular use contemplated. It is intended that the scope of the technology be defined by the claims

What is claimed is:

1. A method for generating a silicon-carbon composite, comprising:
    performing controlled silicon loading on a first carbon substrate in a reactor of a reactor-reservoir system, the controlled silicon loading on the first carbon substrate producing a silicon-carbon composite;
    transferring the silicon-carbon composite from the reactor to a reservoir of the reactor-reservoir system, the transfer of the silicon-carbon composite occurring through a connection mechanism that connects the reactor and the reservoir;
    closing the connection mechanism between the reactor and the reservoir after the transfer of the silicon-carbon to the reservoir; and
    performing a controlled silicon loading on a second carbon substrate in the reactor of the reactor-reservoir system while the first silicon-carbon composite cools in the reservoir,
    wherein the simultaneous silicon loading on the second carbon substrate and cooling of the first silicon-carbon composite produces silicon-carbon composite in a semi-continuous manner.

2. The method of claim 1, wherein the reactor-reservoir system includes a fluidized bed reactor.

3. The method of claim 1, further comprising producing a silicon-carbon composite and/or silicon-graphite composite from the carbon substrate.

4. The method of claim 3, wherein the silicon-carbon and silicon-graphite composites are produced using chemical vapor deposition.

5. The method of claim 3, wherein the silicon-carbon and silicon-graphite composites are produced using thermal deposition.

6. The method of claim 1, wherein a gaseous material precursor decomposes via chemical vapor deposition or thermal deposition.

7. The method of claim 2, further comprising:
    receiving carbon powder into the reactor of the reactor-reservoir system;
    providing an inert gas into the reactor of the reactor-reservoir system;
    heating the reactor during an inert gas flow into the reactor of the reactor-reservoir system;
    introducing reactive gas and a silicon precursor in the reactor of the reactor-reservoir system;
    performing the controlled silicon loading on the first carbon substrate for a predetermined period of time; and
    removing, after performing the controlled silicon loading on a first carbon substrate, the reactive gas and silicon precursor gas used for the controlled silicon loading on the first silicon substrate from the reactor of the reactor-reservoir system.

8. The method of claim 7, further comprising:
    cooling the silicon-carbon composite in the reservoir while the controlled silicon loading on the second carbon substrate is performed.

9. The method of claim 1, wherein the silicon-carbon composite has a secondary, ball-like shape resulting from agglomerated silicon-graphite sheets.

10. The method of claim 9, wherein the secondary, ball-like shape are formed inside the reservoir after transferring silicon-carbon composite from the first reactor into the reservoir while being cooled.

11. The method of claim 10, wherein the secondary, ball-like shaped silicon-carbon composite particle are transferred into the reactor for silicon deposition to further increase the silicon loading.

* * * * *